(12) United States Patent
Nakahara

(10) Patent No.: US 8,941,105 B2
(45) Date of Patent: *Jan. 27, 2015

(54) ZINC OXIDE BASED COMPOUND SEMICONDUCTOR LIGHT EMITTING DEVICE

(75) Inventor: Ken Nakahara, Kypto (JP)

(73) Assignee: Rohm Co., Ltd., Kyoto-shi (JP)

( * ) Notice: Subject to any disclaimer, the term of this patent is extended or adjusted under 35 U.S.C. 154(b) by 1225 days.

This patent is subject to a terminal disclaimer.

(21) Appl. No.: 11/886,918

(22) PCT Filed: Mar. 23, 2006

(86) PCT No.: PCT/JP2006/305805
§ 371 (c)(1),
(2), (4) Date: Sep. 21, 2007

(87) PCT Pub. No.: WO2006/101158
PCT Pub. Date: Sep. 28, 2006

(65) Prior Publication Data
US 2009/0078934 A1 Mar. 26, 2009

(30) Foreign Application Priority Data
Mar. 24, 2005 (JP) .................................. 2005-086978

(51) Int. Cl.
| | |
|---|---|
| *H01L 29/10* | (2006.01) |
| *H01S 5/327* | (2006.01) |
| *H01L 33/28* | (2010.01) |
| *H01L 21/02* | (2006.01) |
| *H01L 33/16* | (2010.01) |
| *H01S 5/042* | (2006.01) |
| *H01S 5/22* | (2006.01) |
| *H01S 5/223* | (2006.01) |

(52) U.S. Cl.
CPC ............... *H01S 5/327* (2013.01); *H01L 33/28* (2013.01); *H01L 21/02403* (2013.01); *H01L 21/02414* (2013.01); *H01L 21/02433* (2013.01); *H01L 21/02554* (2013.01); *H01L 21/02576* (2013.01); *H01L 21/02579* (2013.01); *H01L 21/02609* (2013.01); *H01L 21/02631* (2013.01); *H01L 33/16* (2013.01); *H01S 5/0422* (2013.01); *H01S 5/2224* (2013.01); *H01S 5/2231* (2013.01)
USPC .......................................................... 257/43

(58) Field of Classification Search
USPC ................................................ 438/46; 257/43
See application file for complete search history.

(56) References Cited

U.S. PATENT DOCUMENTS

| | | | |
|---|---|---|---|
| 2004/0165635 A1* | 8/2004 | Sugimoto et al. ................ | 372/46 |
| 2004/0235212 A1* | 11/2004 | Ishizaki .......................... | 438/46 |
| 2005/0242357 A1 | 11/2005 | Uematsu et al. | |

FOREIGN PATENT DOCUMENTS

| | | |
|---|---|---|
| CN | 1524299 A | 8/2004 |
| EP | 1 335 044 A1 | 8/2003 |
| JP | 2002-094114 | 3/2002 |
| JP | 2004-200389 A | 7/2004 |
| JP | 2004-335712 | 11/2004 |
| KR | 2003-0001388 A | 1/2003 |
| WO | WO-01/73170 | 10/2001 |

* cited by examiner

*Primary Examiner* — Yu-Hsi D Sun
(74) *Attorney, Agent, or Firm* — Rabin & Berdo, P.C.

(57) ABSTRACT

There is provided a semiconductor light emitting device in which light emitting efficiency is totally improved in case of emitting a light having a short wavelength of 400 nm or less by raising internal quantum efficiency by enhancing crystallinity of semiconductor layers laminated and by raising external quantum efficiency by taking out the light emitted by preventing the light emitted from being absorbed in the substrate or the like, as much as possible. In case of laminating ZnO compound semiconductor layers (2 to 6) so as to form a light emitting layer forming portion (7) for emitting the light having a wavelength of 400 nm or less on a substrate (1), a substrate composed of $Mg_xZn_{1-x}O$ ($0 \leq x \leq 0.5$) is used as the substrate (1).

4 Claims, 4 Drawing Sheets

COMPRESSIVE FORCE

TENSILE FORCE

ZINC OXIDE BASED COMPOUND SEMICONDUCTOR LIGHT EMITTING DEVICE

FIELD OF THE INVENTION

The present invention relates to a zinc oxide based (hereinafter referred to as ZnO based, too) compound semiconductor light emitting device such as a light emitting diode (LED) or the like, using ZnO based semiconductor such as ZnO, MgZnO based (which means that a mixed crystal ratio of Mg and Zn can be varied variously and the same applies hereinafter) compound or the like. More particularly, the present invention relates to a ZnO based compound semiconductor light emitting device having a structure in which internal quantum efficiency can be improved and, at the same time, external quantum efficiency can be improved by taking out efficiently the light emitted without being absorbed, especially in case of emitting light in a short wavelength range of 400 nm or less.

BACKGROUND OF THE INVENTION

Lately, nitride semiconductor light emitting devices such as a blue light emitting diode (LED) or a laser diode (LD), using nitride semiconductor, have been in practical use. On the other hand, a ZnO based compound is superior to a GaN based compound (which means a GaN or a compound in which a part or all of Ga of GaN is substituted with other element of group III element and the same applies hereinafter) in emitting light in a range of a short wavelength. Concretely, an exciton of ZnO, which is formed by recombination of a hole and an electron in a solid, is stable even in a room temperature because of having a large binding energy of 60 meV (GaN has that of 24 meV). Further, in GaN based compound, although light is emitted with high efficiency by forming an InGaN based compound (which means that a mixed crystal ratio of In and Ga can be varied variously and the same applies hereinafter) by adding In, the efficiency is lowered accompanied with decreasing of In. It is said in case of InGaN based compound that crystal defects are unnoticeable, since portions of low potential arise partially by variation in a concentration of In and carriers are captured there. On the contrary, when In decreases, it is understood that the crystal defects become noticeable since the concentration is unified and especially, portions where carriers are easily captured do not arise. Such problem does not occur in ZnO based compound even the wavelength is shortened, though the InGaN based compound becomes more disadvantageous to shortening the wavelength. Of course, GaN itself or AlGaN based compound (which means that a mixed crystal ratio of Al and Ga can be varied variously and the same applies hereinafter) becomes disadvantageous to further shortening of the wavelength.

A light emitting device having a structure shown in FIG. 6 is known as the light emitting device using ZnO based compound (cf. for example PATENT DOCUMENT 1). In FIG. 7, on a sapphire substrate 31, a buffer layer 32 made of ZnO and an n-type contact layer 33 made of n-type ZnO are formed, and thereon, a light emitting layer forming portion 38 is formed by laminating an n-type clad layer 34 made of MgZnO based compound, an active layer 35 made of CdZnO based compound, and a p-type clad layer 36 made of MgZnO based compound. Further a p-type contact layer 37 made of ZnO is deposited, and a part of the n-type contact layer 33 is exposed by etching a part of a semiconductor lamination portion. Thereafter, an n-side electrode 39 is formed on an exposed surface and a p-side electrode 40 is formed on a surface of the p-type contact layer 37. PATENT DOCUMENT 1: Japanese Patent Application Laid-Open No. 2002-94114.

DISCLOSURE OF THE INVENTION

Problem to be Solved by the Present Invention

In the ZnO based compound semiconductor light emitting device shown in FIG. 6 described above, crystallinity is inferior and internal quantum efficiency becomes apt to lower since the sapphire substrate of a different kind from ZnO based compound is used for the substrate. Besides, when attempting to emit light of a wavelength of 400 nm or more such as blue light by using a mixed crystal with Cd for an active layer as in the example described above, although brightness can be obtained by similar effect to that in In described above, there arises a problem that internal quantum efficiency can not be enhanced in case of light of a short wavelength of, for example, approximately 400 nm or less such as 360 nm, since dislocations arise occasionally because the substrate is made of sapphire, and dislocations are apt to appear by the same reason as that in InGaN based compound.

On the other hand, ZnO substrate is possibly used for a substrate, on which ZnO based compound semiconductor is laminated, as a homogeneous substrate. When such ZnO substrate is used, although a cost becomes high, internal quantum efficiency can be easily improved by growing semiconductor layers with excellent crystallinity because ZnO based compound semiconductor grown thereon is easily matched in lattice with the substrate. However, even when ZnO substrate is used, there arises a problem that external quantum efficiency is lowered since light is absorbed also in the ZnO substrate in case of emitting light of a short wavelength of 400 nm or less described above.

The present invention is directed to solve the above-described problems and an object of the present invention is to provide a zinc oxide based compound semiconductor light emitting device emitting light of a wavelength of 400 nm or less and having a structure in which light emission efficiency can be enhanced generally in case of emitting light of a wavelength of 400 nm or less by enhancing internal quantum efficiency by improving crystallinity of semiconductor layers laminated and, at the same time, external quantum efficiency by taking out the light emitted to the utmost without being absorbed in the substrate or the like.

Another object of the present invention is to provide a zinc oxide based compound semiconductor light emitting device having high internal quantum efficiency without being influenced by a piezoelectric field and raising a drive voltage, even in case of forming a light emitting device by laminating ZnO based compound of piezoelectric material in a hetero junction structure.

Means for Solving the Problem

A zinc oxide based compound semiconductor light emitting device according to the present invention includes a substrate, and a semiconductor lamination portion formed on the substrate by laminating ZnO compound semiconductor layers so as to form a light emitting layer forming portion for emitting light of a wavelength of 400 nm or less, wherein the substrate is made of $Mg_xZn_{1-x}O$ ($0 \leq x \leq 0.5$).

Here, the zinc oxide (ZnO) based compound semiconductor means an oxide including Zn, and means concretely besides ZnO, an oxide of one or more elements of group IIA and Zn, an oxide of one or more elements of group IIB and Zn, or an oxide of elements of group IIA and group II B and Zn.

It is preferable that the substrate is formed such that the substrate is formed such that a mixed crystal ratio x of Mg of the substrate is in a range of $(1,240/\lambda-3.3)/4 \leq x$, thereby the zinc oxide based compound semiconductor device which does not absorb the light emitted can be obtained while the substrate is comparatively easily formed, because the substrate can be made of mixed crystal in which necessary amount of Mg is mixed in accordance with a wavelength of light emitted.

It is preferable that a principal plane of the substrate is a plane A (11-20) or a plane M (10-10), and the ZnO compound semiconductor layers are epitaxially grown in such orientation that a plane parallel to the principal plane is a plane {11-20} or a plane {10-10} and a plane perpendicular to the principal plane is a plane {0001}, because there exists no problem such that an electric field generated by a piezoelectric effect raises a drive voltage, even when the strain is generated in semiconductor layers by lattice mismatching between a substrate and a semiconductor layer or between semiconductor layers laminated because ZnO based compound is piezoelectric, and ZnO based compound semiconductor layers are laminated with a hetero junction structure. The detailed reason will be described later.

Here, each of (11-20), (10-10), {11-20} and {10-10} mean strictly follows, respectively $(11\bar{2}0)$, $(10\bar{1}0)$, $\{11\bar{2}0\}$ and $\{10\bar{1}0\}$, However, an abbreviated notation is used as described above in convenience. In addition, for example, a plane {11-20} means a general term meaning including planes equivalent to a plane (11-20) by symmetry of crystals.

Effect of the Invention

According to the present invention, since $Mg_xZn_{1-x}O$ ($0 \leq x \leq 0.5$) is used for a substrate on which ZnO based compound semiconductor layers are laminated, semiconductor layers with excellent crystallinity can be laminated because the ZnO based compound semiconductor layers are made of compound of same kind as that of the substrate. Moreover, since a band gap energy becomes large because Mg is mixed into a crystal, the light can be utilized efficiently and without wasting, by taking out the light, which travels to a substrate side, from a side or the like without being absorbed in the substrate even in case of emitting light of a short wavelength, in which ZnO is used as a material of an active layer. As a result, internal quantum efficiency can be enhanced by improving crystallinity and, at the same time, a light emitting device excellent in external quantum efficiency in total can be obtained by improving efficiency of taking out the light by taking out the light emitted even traveling to the substrate side, from a side or the like without being absorbed.

EXPLANATION OF LETTERS AND NUMERALS

Figure 1:
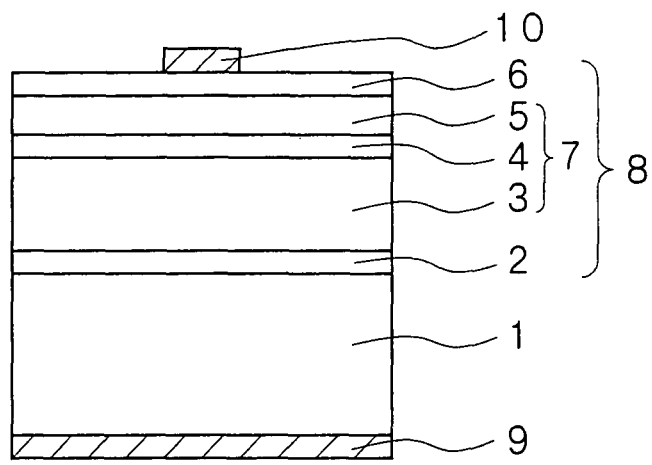
FIG. 1 is a cross-sectional view explaining an LED of an embodiment of the ZnO based compound semiconductor device according to the present invention.

1: substrate
2: n-type buffer layer
3: n-type layer
4: active layer
5: p-type layer
6: p-type contact layer
7: light emitting layer forming portion
8: semiconductor lamination portion
9: n-side electrode
10: p-side electrode

THE BEST EMBODIMENT OF THE PRESENT INVENTION

An explanation will be given below of a zinc oxide based (ZnO based) compound semiconductor light emitting device according to the present invention in reference to the drawings. AS a cross-sectional view explaining of an embodiment is shown in FIG. 1, a light emitting diode (LED) of the ZnO based compound semiconductor light emitting device according to the present invention is characterized in that a substrate composed of $Mg_xZn_{1-x}O$ ($0 \leq x \leq 0.5$) in which Mg is contained in ZnO is used as the substrate 1 in case of laminating ZnO compound semiconductor layers 2 to 6 so as to form a light emitting layer forming portion 7 for emitting the light having a wavelength of 400 nm or less on a substrate 1.

The substrate 1 is made of $Mg_xZn_{1-x}O$ (hereinafter also referred to as simply MgZnO based compound) which is a mixed crystal containing Mg of a concentration of 50 at % (atomic percent) or less. Although the MgZnO based compound substrate is formed in the same manner as, for example, a hydrothermal synthesis method, an ingot of MgZnO based compound can be formed by adding Mg at the time and wafers are cut out of the ingot. It is preferable, as described later, to cut out such that a principal plane is a plane A or a plane M, at the time of cutting out, however, according to the present invention, it is not always necessary that the principal plane is the plane A or the plane M, and the principal plane may be a plane C. In case that a stress between layers becomes a problem, the problem can be solved by inserting a gradient layer or a buffer layer between the layers. In addition, it is preferable to increase a mixed crystal ratio x of Mg of the substrate 1, from the aspect of inhibiting absorption of the light emitted by raising a band gap energy. However, since ZnO based compound is a hexagonal system but MgO is a crystal of NaCl type, matching between both becomes lower and crystallinity deteriorates when the concentration of Mg increases. In any case, the mixed crystal ratio of Mg is necessarily set to 50 at % or less.

The present inventor studied and examined earnestly and repeatedly on a minimum requirement of a mixed crystal ratio of Mg to the substrate, and, as a result, found that crystallinity of the substrate 1, that is, the crystallinity of ZnO based compound semiconductor layers laminated can be maintained satisfactory while inhibiting absorption of the light emitted most effectively, by deciding x so as to satisfy a relationship $$1{,}240/\lambda - 3.3/4 \leq x \quad (1)$$

defined by using a wavelength $\lambda$ of the light emitted and a mixed crystal ratio x of Mg. Here, in Formula (1), $1{,}240/\lambda$ represents a band gap energy Eg corresponding to a wavelength of emitted light, 4x a variation rate of the band gap energy and 3.3 a band gap energy Eg of ZnO. Then, when x satisfies Formula (1) to a wavelength $\lambda$ of the light emitted, light emitted in the light emitting layer forming portion can be hardly absorbed in the substrate 1. On the contrary, since crystallinity is good at a small x, it is preferable that x is a value satisfying a case of equal mark of Formula (1), because crystallinity can be maintained satisfactory while inhibiting absorption of light. However, when x is approximately 0.3 or less, crystallinity is not influenced so much, therefore, it is preferable that x is larger than that of the case of an equal mark from the aspect of inhibiting absorption surely.

Figure 3:
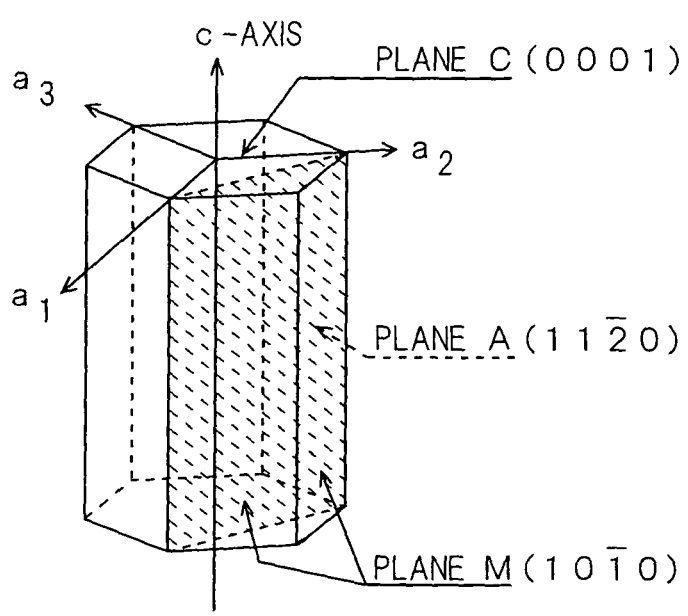
FIG. 3 is a figure showing a plane A and a plane M of a substrate used for a semiconductor device according to the present invention.

Subsequently, there is explained below a reason why it is preferable that a wafer is cut out such that the principal plane of the substrate is the plane A (11-20) or the plane M (10-10) when the wafer is cut out of the above-described ingot of $Mg_xZn_{1-x}O$ ($0 \leq x \leq 0.5$), and that ZnO based compound semiconductor layers are epitaxially grown in such orientation that a plane parallel to the principal plane is the plane {11-20} or the plane {10-10} and a plane perpendicular to the principal plane is the plane {0001}. In addition, ZnO based compound, for example $Mg_xZn_{1-x}O$, has a structure of a hexagonal system as a schematic view of its crystal structure is shown by a perspective view in FIG. 3, the plane A and the plane M are respectively shown in FIG. 3 and both are perpendicular to the plane C. In this case, when semiconductor layers are grown epitaxially on the principal plane of the plane A or the plane M, single crystal layers with excellent crystallinity, in which a c-axis is orientated in a lateral direction along the principal plane, can be obtained, because the substrate is made of MgZnO based compound and laminated semiconductor layers are made of compounds of the same kind such as ZnO or MgZnO based compound.

ZnO based compound is a piezoelectric material and generates a piezoelectric field when a stress is applied. On the other hand, when mixed crystal ratios of Mg are different from each other even between a ZnO layer and a MgZnO based compound layer or between MgZnO based compound layers, a stress is generated between the substrate and a semiconductor layer or between semiconductor layers because lattice constants are different to some extent even in semiconductor of the same kinds. Therefore, when ZnO based compound semiconductor layers are laminated in a structure of a hetero junction, a piezoelectric field is generated, thereby a built-in voltage is raised and a drive voltage is finally raised because the piezoelectric field becomes a potential barrier newly added.

Figure 5:
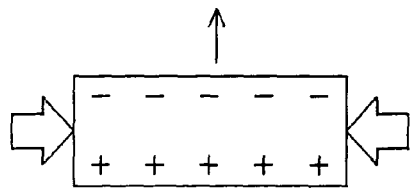
FIG. 5 is a figure explaining generation of electric charges in case of applying stress to a piezoelectric crystal.
Figure 5:
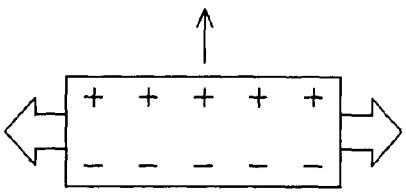
Figure 5:
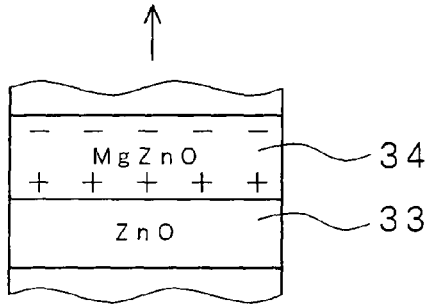
Figure 6:
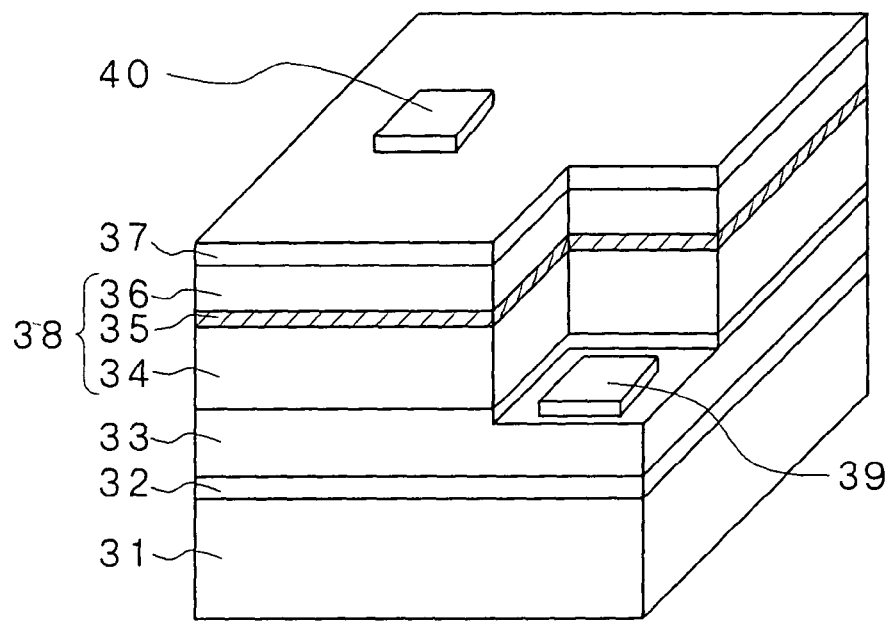
FIG. 6 is a figure showing an example of constitution of an LED by the prior art, using ZnO based compound semiconductor.

In further detail on a piezoelectric field, when stress is applied to a crystal having piezoelectricity as shown in FIGS. 5(a) and 5(b), a piezoelectric field generates electric charges of + or − reversely whether the stress is a compressive force or a tensile force. On the contrary, a crystal of a hexagonal system such as ZnO has no symmetricity in a direction of the c-axis, and the c-axis direction (surfaces perpendicular to the plane C) is a nonpolar plane in which two directions distinguished by deviation of electric charge exist. Therefore, electric charges of + and − are generated on both sides of the plane C of the crystal by the stress described above, and electric charges are not generated or generated very slightly on the plane A or the plane M which are nonpolar planes. And it was found that a cause of rising of a drive voltage is rising of a built-in voltage caused by arising of electric charges of + at a side of a ZnO layer 33 on a MgZnO layer 34 in which a compressive strain is generated and electric charges of a reverse polarity at a reverse side, as shown in FIG. 5(c), when the ZnO layer 33 and the MgZnO layer 34 are laminated on the plane C of the substrate. However, when the principal plane is the plane A or the plane M, the drive voltage can not be influenced any more, even if a piezoelectric field is generated, because a direction of applying a drive voltage and the plane C in which electric charges are generated are parallel.

In an example shown in FIG. 1, the semiconductor lamination portion 8 is composed of a buffer layer 2 made of n-type ZnO and having a thickness of, for example, approximately 10 nm, a light emitting layer forming portion 7 and a contact layer 6 made of P-type ZnO and having a thickness of approximately 10 to 30 nm. However, this example is shown as an example of a simple structure and the structure is not limited to the lamination structure.

In the example shown in FIG. 1, the light emitting layer forming portion 7 is formed in a double hetero junction structure in which an active layer 4 is sandwiched by an n-type layer 3 and a p-type layer 5 which are made of $Mg_yZn_{1-y}O$ ($0 \leq y \leq 0.3$, for example y=0.1) having a band gap energy larger than that of the active layer 4. Although not shown in the figure, the active layer 4 is formed in a multi quantum well structure (MQW) which is formed in a lamination structure composed of, for example from a lower layer side, an n-type guide layer made of n-type $Mg_zZn_{1-z}O$ ($0 \leq z \leq 0.15$, for example z=0.05) having a thickness of approximately 0 to 15 nm, a lamination portion formed by laminating a $Mg_{0.1}Zn_{0.9}O$ layer having a thickness of approximately 6 to 15 nm and a ZnO layer having a thickness of approximately 1 to 5 nm, alternately six times, and a p-type guide layer made of p-type $Mg_zZn_{1-z}O$ having a thickness of approximately 0 to 15 nm, so as to emit light having, for example, a wavelength of approximately 365 nm. However, the structure of the light emitting layer forming portion 7 is not limited to this example, and, for example, a structure of the active layer 4 may be a single quantum well (SQW) structure or a bulk structure, and a p-n structure of a single hetero junction may be used instead of the double hetero junction. In addition, the n-type layer 3 or the p-type layer 5 may be formed in a structure of a lamination by a barrier layer and a contact layer, a gradient layer may be provided between layers of a hetero junction, and still, a reflection layer may be formed at a substrate side.

Then, after a back surface of the substrate 1 is polished so that a thickness of the substrate 1 is approximately 100 μm, an n-side electrode 9 is formed by laminating Ti and Al on the back surface and sintering. And a p-side electrode 10 is formed in a lamination structure of Ni/Au by a lift off method on a surface of the p-type contact layer 6. Thereafter, a wafer is divided into chips. The n-side electrode 9 may be formed on a surface of the n-type layer 3 exposed by etching a part of the semiconductor lamination portion 8 instead of forming on the back surface of the substrate 1.

In manufacturing the light emitting diode, firstly a wafer is formed by cutting an ingot of ZnO based compound made by, for example, a hydrothermal synthesis method at a plane A (11-20) or a plane M (10-10) and polishing by a CMP (chemical mechanical polish) method. An MBE apparatus is used in growing ZnO based compound, which is equipped with a radical source generating oxygen radical in which reaction activity of oxygen is enhanced by RF plasma. A radical source of the same type is prepared for nitrogen of a dopant of p-type ZnO. Metal Zn, metal Mg or the like having a purity of 6-N (99.9999%) or more is used for a Zn source, a Mg source and a Ga source (n-type dopant) and vaporized from a knousen cell (evaporation source). A shroud in which liquid nitrogen flows is provided around the MBE chamber so that a wall surface is not heated by heat radiation from the cell or a substrate heater. Thereby, high vacuum of approximately $1\times10^{-9}$ Torr can be maintained inside of the chamber.

The above-described wafer made of MgZnO based compound and polished by the CMP method is set within the MBE apparatus, a thermal cleaning is carried out at a temperature of approximately 700° C. Thereafter the temperature of the substrate is lowered to approximately 600° C. and the n-type buffer layer 2 is grown. Then, the semiconductor lamination portion 8 is formed by growing successively each layer of the above-described constitution. Then, as described above, after thinning the substrate 1, there are formed the p-side electrode 10 of the lamination structure of Ni/Au on the p-type contact layer 6 of a surface side by a lift off method using a vapor deposition method or the like, and the n-side electrode 9 ensuring ohmic characteristics by sintering Ti/Al laminated on a back surface of the substrate 1 at 600° C. and for approximately 1 min. Thereafter, chips are obtained from the wafer by dicing or the like.

Figure 2:
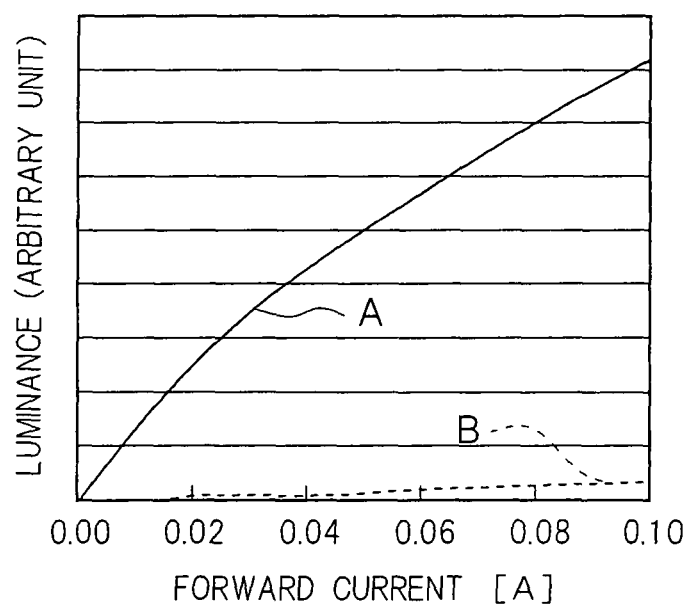
FIG. 2 is a figure showing light emitting characteristics of an LED having a structure shown in FIG. 1, comparing with that of an LED formed in the same manner with a substrate made of ZnO.

A relationship of luminance (arbitrary unit) to electric current (unit: A) of an LED formed in such manner is shown in FIG. 2. Namely, FIG. 2 shows a relation of increase of the luminance when a forward current which is represented by a lateral axis increases. In FIG. 2, 'A' represents characteristics of the LED according to the present invention, which emits light of a wavelength of 365 nm with the substrate made of $Mg_{0.1}Zn_{0.9}O$, and 'B' represents characteristics of an LED with a substrate made of ZnO emitting light with the same wavelength, respectively. As obvious from FIG. 2, luminance of ten times of that by using ZnO can be obtained by using the substrate mixed with Mg according to the present invention.

Although the above-described example is an example of an LED, since, in a laser diode, a semiconductor lamination portion of a hetero junction is formed and a drive voltage is applied in a direction perpendicular to the lamination portion, a semiconductor laser with a high characteristics of a low drive voltage and a low threshold current can be obtained by using the substrate 1 made of $Mg_xZn_{1-x}O$ ($0 \leq x \leq 0.5$) in which the plane A (11-20) or the plane M (10-10) is the principal plane and by growing semiconductor layers epitaxially in such orientation that the plane parallel to the principal plane is the plane {11-20} or the plane {10-10} and the plane perpendicular to the principal plane is the plane {0001}. An example of a structure of such semiconductor laser is shown in FIG. 4.

Figure 4:
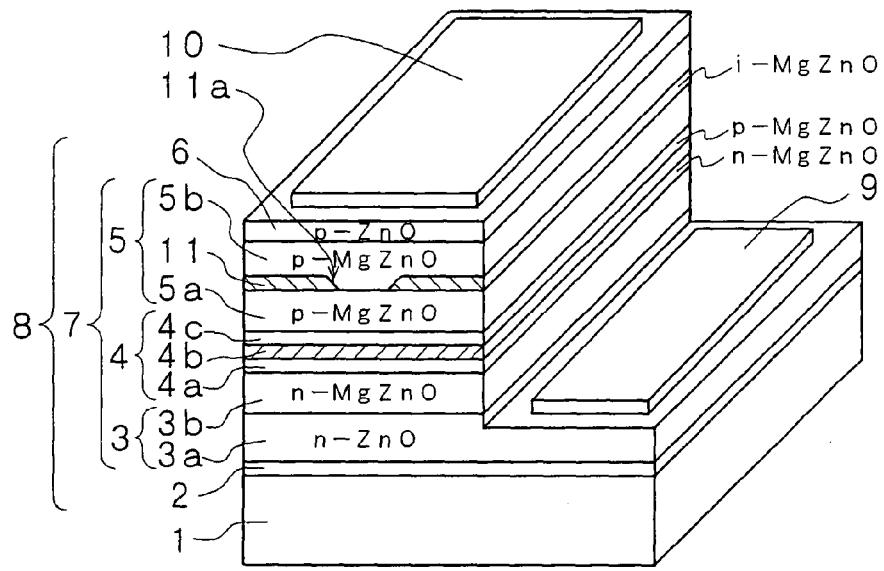
FIG. 4 is a cross-sectional view showing an example of constitution of an LD formed by the present invention.

A substrate 1 and a buffer layer 2, in FIG. 4, are same as those in the example shown in FIG. 1. In the example, a light emitting layer forming portion 7 is composed of an n-type layer 3 composed of an n-type contact layer 3a made of ZnO and a barrier layer (clad layer) 3b made of $Mg_yZn_{1-y}O$ ($0 \leq y \leq 0.3$, for example y=0.2), an active layer 4 composed of an n-type guide layer 4a made of n-type $Mg_zZn_{1-z}O$ (for example z=0.05), a lamination portion 4b made of $Mg_{0.1}Zn_{0.9}O/ZnO$, and a p-type guide layer 4c made of p-type $Mg_zZn_{1-z}O$, and a p-type layer 5 which is divided into a first layer 5a and a second layer 5b which are made of same $Mg_yZn_{1-y}O$ ($0 \leq y \leq 0.3$), and between them, an electric current constriction layer 11 provided with a stripe groove 11a and made of $Mg_aZn_{1-a}O$ ($0 \leq a \leq 0.3$, for example a=0.15) of an i-type or n-type is inserted. Then, on a surface thereof, a p-type contact layer 6 made of p-type ZnO is laminated, and, as a result, the semiconductor lamination portion 8 is composed of the buffer layer 2 to the contact layer 6. Subsequently, a p-side electrode 10 is made of same material as that described above on the contact layer 6 and it is formed on almost whole surface in this case since light is not taken out from a surface side of the lamination portion, and an n-side electrode 9 is formed on the n-type contact layer 3a exposed by removing a part of the semiconductor lamination portion 8 by etching. The n-side electrode 9 may be formed on a back surface of the substrate 1, same as in the example shown in FIG. 1.

INDUSTRIAL APPLICABILITY

The light emitting device emitting light having a wavelength in a range of 400 nm or less can be used for a light source of a lighting lamp of white color by coating a surface with a light color conversion resin converting ultraviolet light to white light and a UV lamp for disinfecting, air cleaning or the like.

What is claimed is:

1. A zinc oxide based compound semiconductor light emitting device comprising
    a substrate having opposed front and back surfaces thereof,
    a semiconductor lamination portion formed on the front surface of the substrate by laminating ZnO based compound semiconductor layers so as to form a light emitting layer forming portion configured to emit light of a wavelength of 400 nm or less, and
    first and second electrodes, the first electrode provided on the semiconductor lamination portion, and the second electrode provided on the back surface of the substrate,
    wherein the substrate is made of $Mg_xZn_{1-x}O$ ($0 \leq x \leq 0.5$).

2. The zinc oxide based compound semiconductor light emitting device according to claim 1, wherein the substrate is formed such that a mixed crystal ratio x of Mg of the substrate is in a range of $(1,240/\lambda-3.3)/4 \leq x$.

3. The zinc oxide based compound semiconductor light emitting device according to claim 1, wherein a principal plane of the substrate is a plane A (11-20) or a plane M (10-10), and the ZnO based compound semiconductor layers are epitaxially grown in such orientation that a plane of the ZnO based compound semiconductor layers parallel to the principal plane of the substrate is a plane {11-20} or a plane {10-10} and a {0001} plane of the ZnO based compound semiconductor layers perpendicular to the principal plane of the substrate is parallel to a plane C {0001} of the substrate.

4. The zinc oxide based compound semiconductor light emitting device according to claim 2, wherein a principal plane of the substrate is a plane A (11-20) or a plane M (10-10), and the ZnO based compound semiconductor layers are epitaxially grown in such orientation that a plane of the ZnO based compound semiconductor layers parallel to the principal plane of the substrate is a plane {11-20} or a plane {10-10} and a {0001} plane of the ZnO based compound semiconductor layers perpendicular to the principal plane of the substrate is parallel to a plane C {0001} of the substrate.

* * * * *